(12) United States Patent
Lin et al.

(10) Patent No.: US 6,296,987 B1
(45) Date of Patent: Oct. 2, 2001

(54) METHOD FOR FORMING DIFFERENT PATTERNS USING ONE MASK

(75) Inventors: Benjamin Szu-Min Lin; Chien-Li Kuo, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/421,309

(22) Filed: Oct. 20, 1999

(51) Int. Cl.[7] ............................................. G03F 9/00
(52) U.S. Cl. ........................ 430/314; 430/394; 430/311
(58) Field of Search ................................... 430/311, 313, 430/314, 394; 216/13, 41

(56) References Cited

U.S. PATENT DOCUMENTS 5,292,623 * 3/1994 Kemp et al. ........................ 430/313
5,439,764 * 8/1995 Alter et al. .............................. 430/5
6,114,095 * 9/2000 Nakabayashi et al. .............. 430/311

* cited by examiner

Primary Examiner—Janet Baxter
Assistant Examiner—Amanda C. Walke
(74) Attorney, Agent, or Firm—Thomas, Kayden, Horstemeyer & Risley, LLP

(57) ABSTRACT

A method for forming different patterns using one phase shifting mask. The phase shifting mask has a bit line contact pattern and a node contact pattern thereon. The exposure pattern is changed by using different defocus conditions. In a first defocus situation, the bit line contact pattern and the node contact pattern of the PSM are simultaneously transferred to a photoresist layer. However, in a second defocus situation, only the bit line contact pattern is transferred to the photoresist layer. A phase shifting mask thus can be used in two different photolithography processes.

13 Claims, 2 Drawing Sheets

METHOD FOR FORMING DIFFERENT PATTERNS USING ONE MASK

BACKGROUND OF THE INVENTION

1. Field of the Invention

The invention relates in general to a method of using a phase shifting mask, and more particularly to a method for forming different patterns using one phase shifting mask (PSM).

2. Description of the Related Art

Currently, since the resolution of the exposure process can be improved by using a phase shifting mask (PSM), photolithography is performed with a PSM in the integrated circuit. A patterned PSM comprises a transparent region and an opaque region, and the transparent region further comprises a phase shifting region and a non-phase shifting region. When an optical beam passes through the phase shifting region, the phase of the wave of the optical beam is reversed by the phase shifting region. Therefore, a wave of an optical beam passing through a photomask in the phase shifting region is different from that passing through the non-phase shifting region of the PSM with a optical phase difference. When photolithography is performed, because of interference between the wave of the optical beam passing through the phase shifting region and that passing through the non-phase shifting region, the images projected close to one another can be completely separated. Hence, the resolution of the exposure process is greatly improved. A Levenson PSM is a conventional PSM and is also called an "alternating PSM".

Conventionally, the phase shifting region and the non-phase shifting region of a Levenson-type phase shifting mask can be adjusted by the thickness of the photomask substrate. It is necessary to perform the E-beam writing process and the etching process twice to manufacture a Levenson-type phase shifting mask. A first E-beam writing process and a first etching process are used to define a transparent region and an opaque region on a photomask substrate. A second E-beam writing process and a second etching process are used to form a trench in the photomask substrate to define a phase shifting region. The phase of the wave after the optical beam passes through the photomask relates to the thickness of the photomask substrate that the optical beam has passed through. Therefore, the depth of the trench should be accurately controlled to obtain 180 degree optical phase difference between the wave of an optical beam passing through the phase shifting region and that passing through non-phase shifting region.

A structure of the Levenson-type phase shifting mask comprises a phase shifting layer formed on a chromium film over a quartz substrate. The phase shifting layer includes $MoSi_2O_xN_y$ or $SiO_xN_y$. When a light passes through the Levenson-type PSM, the phase shifting layer shifts the light wave phase by 180 degrees (negative phase). Light passing through an exposed portion of the quartz substrate forms the light wave phase by 0 degrees (positive phase). Since phase shifting regions and non-phase shifting regions are cross-set, a light intensity of zero occurs at the interface between the positive phase and the negative phase. A light intensity with a better pattern resolution is obtained.

However, device dimension is shrunk so that photomask fabrication becomes more difficult and more complex than before. Thus, more photolithography processes are used while fabricating semiconductor devices, making the masks more expensive.

SUMMARY OF THE INVENTION

The invention provides a method for forming different patterns using one phase shifting mask. A phase shifting mask is provided. The phase shifting mask comprises a bit line contact pattern and a node contact pattern thereon. The exposure pattern is changed by using different defocus conditions. In a first defocus situation, the bit line contact pattern and the node contact pattern of the PSM are transferred to a photoresist layer at the same time. However, in a second defocus situation, only the bit line contact pattern is transferred to the photoresist layer.

The PSM provided in the invention can be used in two photolithography processes. When compared with a conventional semiconductor fabrication, the invention eliminates the making and use of at least one mask, which can save number and cost of masks used.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
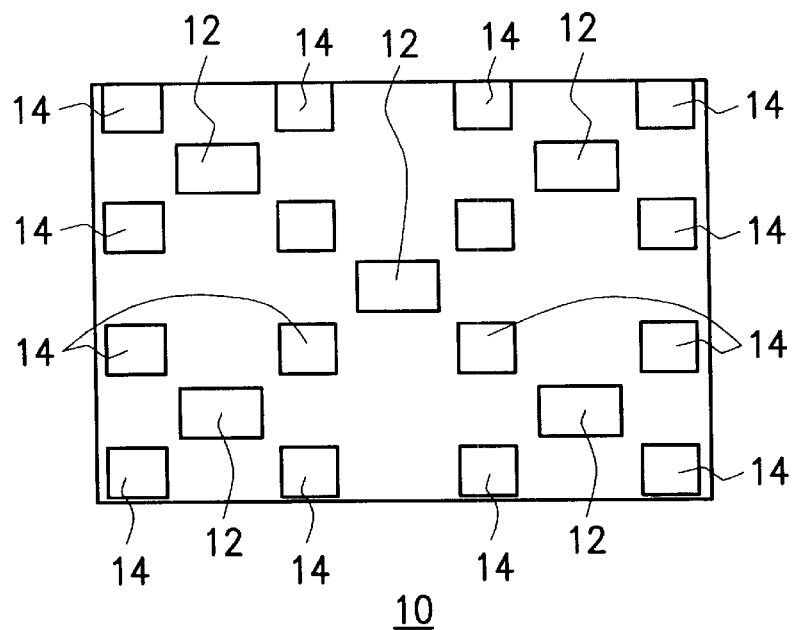
FIG. 1 is a cross-sectional view showing a layout of an alternating PSM according to one preferred embodiment of the invention.

FIG. 1 is a cross-sectional view showing a layout of the alternating PSM of one preferred embodiment of the invention. Referring to FIG. 1, a phase shifting mask 10 is provided. A bit line contact pattern 12 and a node contact pattern 14 are formed on the phase shifting mask 10. Light passing through the bit line contact pattern 12 causes a first phase. Light passing through the node contact pattern 14 causes a second phase. The first phase and the second phase are complementary. For example, the first phase is 0° and the second phase is 180°. The size of the bit line contact pattern 12 is larger than the size of the node contact pattern 14.

Figure 2A:
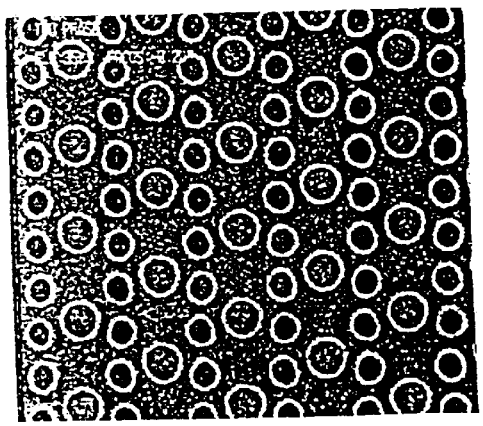
FIG. 2A is an exposure pattern created using the alternating PSM shown in FIG. 1 under an exposure condition of −0.2 μm.
Figure 2B:
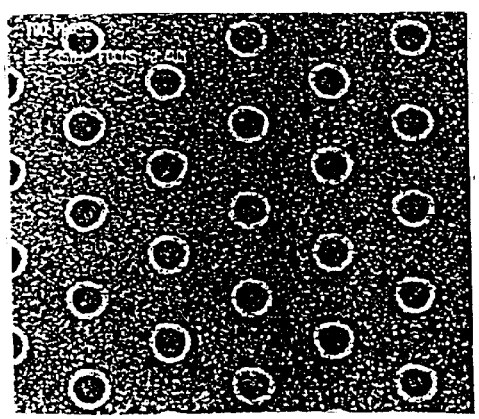
FIG. 2B is an exposure pattern created using the alternating PSM shown in FIG. 1 under an exposure condition of +0.4 μm.

FIG. 2A and FIG. 2B are exposure patterns created using the provided alternating PSM shown in FIG. 1.

FIG. 2A is an exposure pattern formed under a first exposure condition of −0.2 μm. The exposure pattern comprises the bit line contact pattern 12 with 0° phase and the node contact pattern 14 with 180° phase.

FIG. 2B is an exposure pattern formed at a second exposure condition of +0.4 μm. The exposure pattern only comprises the bit line contact pattern with 0° phase. The node contact pattern 14 is not formed under the second exposure condition. The reason is that a window of focus deviation (defocus) of the bit line contact pattern 12 is larger than of the node contact pattern 14. When the exposure condition is defocused, the bit line contact pattern 12 is exposed more easily than the node contact pattern 14.

Figure 3A:
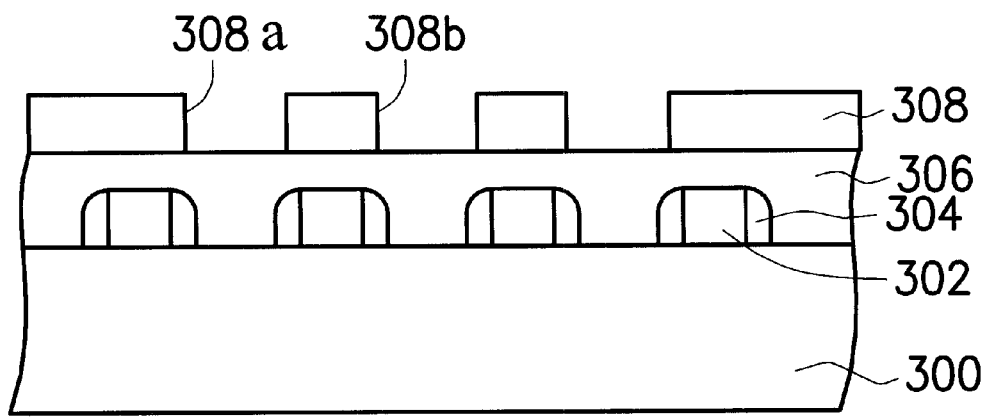
FIG. 3A is a cross-sectional view showing semiconductor structure after performing a first photolithography process using the alternating PSM of the preferred embodiment of the invention.
Figure 3B:
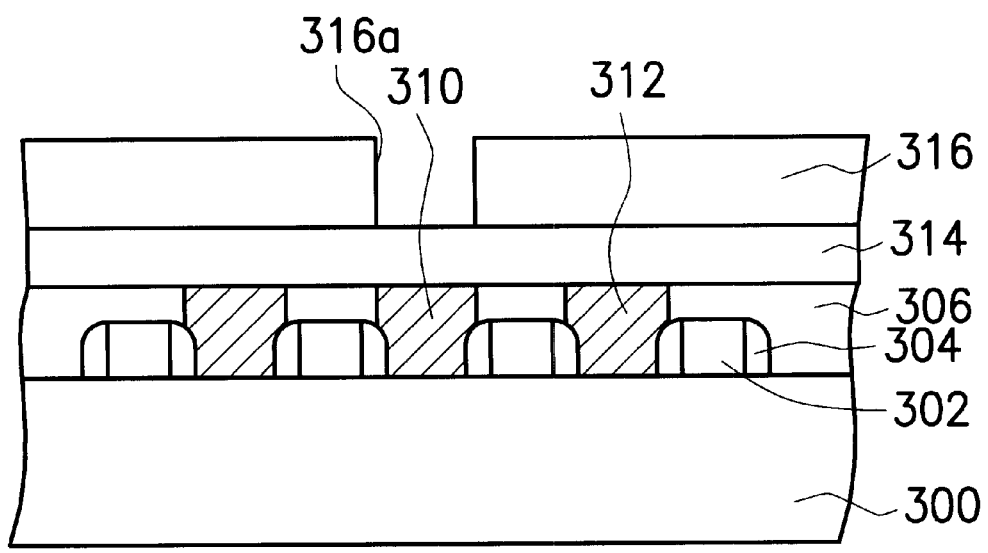
FIG. 3B is a cross-sectional view showing semiconductor structure after performing a second photolithography process using the alternating PSM of the preferred embodiment of the invention.

FIG. 3A and FIG. 3B are cross-sectional views showing semiconductor structure fabrication using the alternating PSM of the preferred embodiment of the invention.

Referring to FIG. 3A, a semiconductor substrate 300 is provided. A conductive structure 302, such as gate electrode or word line, is formed on the substrate 300. A spacer 304 is formed on the sidewall of the conductive structure 302. A first dielectric layer 306 is formed over the substrate 300 to cover the structure described above. The first dielectric layer 306 also has a planar top surface.

A first photoresist layer 308 is formed on the first dielectric layer 306. Then, a first photolithography process is performed using the PSM shown in FIG. 1. The bit line contact pattern 12 and the node contact pattern 14 shown in FIG. 1 are transferred to the first photoresist layer 308 under a exposure condition with focus or light defocus, such as a defocus of about −0.2 μm. After development, a bit line contact opening 308a and a node contact opening 308b are formed within the first photoresist layer 308.

Referring to FIG. 3B, the first dielectric layer 306 is etched according to the pattern of the first photoresist layer 308. The first dielectric later 306 is filled with a metal material to form a bit line contact 310 and a node contact 312.

Still referring to FIG. 3B, the first photoresist layer 308 is removed. A second dielectric layer 314 with a planar top surface is formed on the first dielectric layer 306. A second photoresist layer 316 is formed on the second dielectric layer 314. A second photolithography process is performed using the PSM shown in FIG. 1. The bit line contact patterns 12 shown in FIG. 1 are transferred to the second photoresist layer 316 under an exposure condition with high defocus, such as a defocus of about +0.4 μm. After development, a bit line contact opening 316a is formed within the second photoresist layer 316. It should be noted that there is no node contact pattern formed in the second photoresist layer 316.

The invention provides a method for forming different patterns on a semiconductor substrate using one phase shifting mask under different exposure conditions. Thus, the PSM can be used in several photolithography processes to eliminate mask number. Since designing a mask pattern is difficult and complex, and requires a high cost, fewer masks are used in a semiconductor fabrication, and the cost is lower.

Furthermore, the bit line contact pattern and the node contact pattern are designed on the same mask. The bit line contact and the node contact are formed at the same time after performing the first photolithography process. Thus, misalignment does not occur between the bit line contact and the node contact.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming different patterns using one phase shifting mask, comprising the steps of:

providing a semiconductor substrate, wherein at least one conductive structure with a spacer on its sidewall is formed thereon;

forming a first dielectric layer over the semiconductor substrate, the first dielectric layer having a planar top surface;

forming a first photoresist layer on the first dielectric layer;

providing a mask over the first photoresist layer, wherein the mask comprises a bit line contact pattern and a node contact pattern;

performing a first photolithography process to transfer the bit line contact pattern and the node contact pattern to the first photoresist layer;

etching the first dielectric layer according to the bit line contact pattern and the node contact pattern of the first photoresist layer to form a bit line contact opening and a node contact opening;

removing the first photoresist layer;

forming a conductive material within the bit line contact opening and the node contact opening;

forming a second dielectric layer on the first dielectric layer and on the conductive material;

providing a second photoresist layer over the second dielectric layer; and performing a second photolithography process using the mask to transfer only the bit line contact pattern to the second photoresist layer.

2. A method according to claim 1, wherein the mask comprises an alternating phase shifting mask.

3. A method according to claim 1, wherein a phase of the bit line contact pattern and a phase of the node contact pattern are complementary.

4. A method according to claim 1, wherein the bit line contact pattern is at a 0° phase, and the node contact pattern is at a 180° phase.

5. A method according to claim 1, wherein a window of focus deviation of the bit line contact pattern is larger than that of the node contact pattern.

6. A method for forming different patterns using one phase shifting mask, comprising the steps of:

providing a phase shifting mask comprising a bit line contact pattern and a node contact pattern;

performing a first photolithography process under a first exposure condition to transfer the bit line contact pattern and the node contact pattern to a first photoresist layer; and performing a second photolithography process under a second exposure condition to transfer only the bit line contact pattern to a second photoresist layer.

7. A method according to claim 6, wherein the phase shifting mask comprises an alternating phase shifting mask.

8. A method according to claim 6, wherein a phase of the bit line contact pattern and a phase of the node contact pattern are complementary.

9. A method according to claim 6, wherein the bit line contact pattern is at a 0° phase, and the node contact pattern is at a 180° phase.

10. A method according to claim 6, wherein the first exposure condition is a complete focus.

11. A method according to claim 6, wherein the first exposure condition is a defocus of about −0.2 μm.

12. A method according to claim 6, wherein the second focus condition is a defocus of about +0.4 μm.

13. A method according to claim 6, wherein a window of focus deviation of the bit line contact pattern is larger than that of the node contact pattern.

* * * * *